(12) United States Patent
Buijsse et al.

(10) Patent No.: US 7,456,413 B2
(45) Date of Patent: Nov. 25, 2008

(54) APPARATUS FOR EVACUATING A SAMPLE

(75) Inventors: Bart Buijsse, Eindhoven (NL); Mark Theo Meuwese, Eindhoven (NL); Maria Van Wely-Dieleman, Eindhoven (NL); Sjoerd Antonius Maria Mentink, Eindhoven (NL); Theodorus Hubertus Josephus Bisschops, Eindhoven (NL)

(73) Assignee: FEI Company, Hillsboro, OR (US)

( * ) Notice: Subject to any disclaimer, the term of this patent is extended or adjusted under 35 U.S.C. 154(b) by 482 days.

(21) Appl. No.: 11/169,274

(22) Filed: Jun. 28, 2005

(65) Prior Publication Data
US 2006/0284108 A1    Dec. 21, 2006

(30) Foreign Application Priority Data
Jul. 1, 2004    (NL) ................... 1026547

(51) Int. Cl.
*G01F 23/00*    (2006.01)
(52) U.S. Cl. .............. 250/441.11; 250/306; 250/307; 250/442.11
(58) Field of Classification Search ............ 250/441.11, 250/306–443.1
See application file for complete search history.

(56) References Cited

U.S. PATENT DOCUMENTS

| | | | | |
|---|---|---|---|---|
| 4,080,526 A | | 3/1978 | Kihara et al. | |
| 4,425,508 A | * | 1/1984 | Lewis et al. | 250/442.11 |
| 4,584,479 A | * | 4/1986 | Lamattina et al. | 250/441.11 |
| 4,607,167 A | * | 8/1986 | Petric | 250/492.2 |
| 4,818,838 A | * | 4/1989 | Young et al. | 219/121.12 |
| 5,103,102 A | * | 4/1992 | Economou et al. | 250/492.2 |
| 6,710,354 B1 | | 3/2004 | Koch et al. | |
| 6,844,922 B2 | * | 1/2005 | Bisschops et al. | 355/76 |
| 2003/0102436 A1 | | 6/2003 | Benas-Sayag et al. | |
| 2003/0116718 A1 | | 6/2003 | Yamamoto et al. | |

FOREIGN PATENT DOCUMENTS

JP    2000-340153    12/2000

* cited by examiner

*Primary Examiner*—David A. Vanore
*Assistant Examiner*—Andrew Smyth

(57) ABSTRACT

The invention relates to an apparatus for evacuating samples. A sample 4 is hereby placed in a cavity 3 of a sheet 1 with a smooth surface 2. A sole plate 5 Is placed upon this smooth surface 2, whereby the smooth surface 2 and the sole plate 5 placed thereupon together form a vacuum seal. The sole plate 5, upon which a vacuum column 6 is mounted, can be slid across the smooth surface 2. By sliding the sole plate 5 over the cavity 4, the cavity 4 is evacuated in several steps.

Figure 1A:
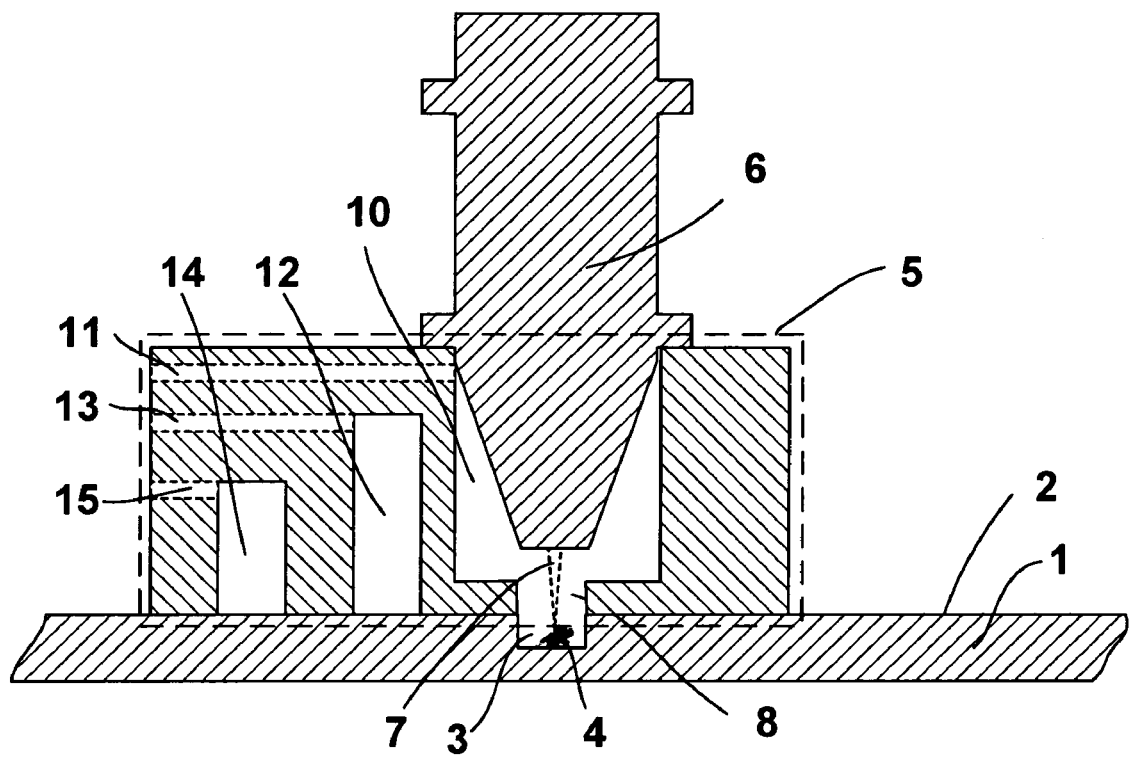

In an embodiment of the invention, the vacuum column 6 takes the form of an ESEM (Environmental Scanning Electron Microscope). In this way, it is possible to inspect the evacuated sample 4 with the ESEM.

22 Claims, 2 Drawing Sheets

APPARATUS FOR EVACUATING A SAMPLE

The invention relates to an apparatus for evacuating at least a portion of a sample, comprising:

A sheet provided with a smooth surface, in which smooth surface at least one hole is created in which to place the sample;

A sole plate that is slidable with respect to the smooth surface, which sole plate demonstrates a sealing surface with respect to the smooth surface;

Which sole plate presents a through-hole in such a manner that one end of the through-hole penetrates the sealing surface and the other end of the through-hole is connected to the inside of a vacuum column.

Such an apparatus is known from U.S. Pat. No. 6,710,354

Such an apparatus can be employed in, for example, the semiconductor industry for inspection of wafers, whereby, with the aid of a Scanning Electron Microscope (SEM) via irradiation with an electron beam, information is obtained over the wafer.

The known apparatus comprises a sheet with a flat upper surface in which a hole is created. A wafer that is to be inspected can be placed in this hole. Positioning means are fitted in the hole, which means can height-position a wafer placed in the hole in such a manner that the upper surface of the wafer is accurately located in a single plane with the upper surface of the sheet.

A sole plate is placed on the sheet and movable across the sheet. This sole plate presents a central through-hole. A vacuum column in the form of a SEM column is mounted on the sole plate in such a manner that the evacuated inside of the SEM column is connected to the through-hole. Using the SEM column, the wafer can be analyzed via the through-hole in the sole plate. In the sole plate, in the surface that neighbors the sheet, a number of hollows are created concentrically around the central through-hole, which hollows are connected to vacuum pumps. In this manner, it is possible to create a local vacuum at the location of the through-hole, as is necessary for the operation of the SEM column.

Due to the presence of an air bearing in the sole plate, the sole plate can be moved across the upper surface of the sheet using very little force. The gap between the sheet and the sole plate is kept so small (typically a few micrometers) that this does not give rise to an unacceptable vacuum leak.

The outline of the hole in the sheet is virtually identical to the outline of the wafer to be placed therein. As a result, the gap between the wafer and the sheet is so tiny that, even if the through-hole of the sole plate is positioned above this gap, this does not give rise to an unacceptable vacuum leak.

In operation, a wafer is placed in the hole in the sheet. In this situation, the sole plate, with the column mounted thereupon, is placed on the sheet in such a manner that the hole in the sheet is completely free. Hereafter, the upper surface of the wafer is positioned in height until this is located in a single plane with the upper surface of the sheet. Thereafter, the sole plate (with the column mounted thereupon) is slid to a position on the wafer at which there is a region of interest. The sole plate will hereby cross over from the sheet to the upper surface of the wafer, which is located at the same height.

A disadvantage of the known apparatus is that this can only be used for very flat samples, such as wafers. This is because the sole plate seals onto the wafer, and the gap between the sole plate and the wafer must be very small in order to prevent a vacuum leak.

Another disadvantage is that the sample must be sufficiently rigid in form so as not to deform under the influence of the locally occurring vacuum forces. An easily deformable sample, such as a biological sample or a plastic foil, runs the risk of being "sucked up", or at least of being damaged.

Still another disadvantage is that the sample to be placed in the hole must have an outline that is virtually the same as the outline of the hole. This is because, if the outline of the hole deviates from the outline of the sample, a gap will occur between the sample and the sheet. When the through-hole in the sole plate is then moved over this gap, a vacuum leak will arise, causing a disturbance to the vacuum of the vacuum column connected to the through-hole.

The invention aims to provide an apparatus that does not demonstrate said disadvantages.

To this end, an apparatus according to the invention is characterized in that:

The entire sample is evacuated;

The sole plate can fully cover the hole.

The invention is based on the insight that, if the sole plate can fully seal off the hole, the sample can be evacuated in its entirety, and the form of the sample is no longer of relevance. This is because the sole plate demonstrates a sealing surface with respect to the sheet, and no sealing needs to occur between the sample and the sole plate.

In this manner, it is also possible to evacuate a sample with an irregular form.

It will also be apparent that the form of the outline of the sample is of no importance, at least as long as the sample fits entirely within the hole.

It is also possible to evacuate samples that are not rigid in form, such as a biological sample or a plastic foil. This is because the sample is evacuated without exerting local vacuum forces on the sample.

It should be mentioned that it is not necessary that the smooth surface and the sole plate assume the form of two flat planes. It is sufficient for the smooth surface and the sole plate to demonstrate a sealing surface and to be slidable with respect to one another. An embodiment in which the smooth surface and the sole plate assume the form of portions of a cylindrical surface, for example, is also satisfactory.

Further, it should be mentioned that embodiments are possible whereby the sheet is kept stationary with respect to the "fixed world" while the vacuum column is moved thereupon, but that embodiments are also possible whereby the vacuum column is kept stationary and the sheet is moved. It is only essential that the sheet and vacuum column be movable with respect to one another.

In an embodiment of the invention, vacuum means are present to evacuate the hole before connecting it to the vacuum column, by connecting the hole to at least one vacuum buffer volume, which vacuum buffer volume has a volume greater than the volume of the hole.

Evacuating a volume with the aid of a vacuum pump can be relatively time-consuming, depending on the capacity of the vacuum pump and the cross-section and length of the connection between the pump and the space to be evacuated. By connecting the hole in which the sample lies to a vacuum buffer volume, the pressure in the hole is lowered almost instantaneously.

In a further embodiment of the invention, the vacuum means assume the form of vacuum means to successively connect the hole to a number of vacuum buffer volumes.

By connecting the hole successively to different vacuum buffer volumes, the pressure in the hole can be lowered to the desired vacuum pressure in different steps. After having being connected to the hole (whereby the pressure in the vacuum buffer volume has increased), the non-connected vacuum buffer volume can once again be entirely evacuated using a pump system with limited capacity.

In another embodiment of the invention, the vacuum buffer volume is connected to a hollow in the sealing surface of the sole plate.

By connecting the vacuum buffer volume to a hollow in the sealing surface of the sole plate, it is possible to connect the hole to the vacuum buffer volume by positioning the hollow above the hole. By now moving the sole plate in such a manner that the hollow, which is connected to the vacuum buffer volume, comes into vacuum contact with the hole, the pressure in the hole will be decreased. Hereafter, the through-hole of the sole plate can be positioned above the hole, so that the hole becomes connected to the vacuum column that is mounted on the sole plate. In this manner, evacuation of the hole occurs by moving the sole plate, without using separate vacuum valves.

It should be mentioned that, if there are several hollows present that are connected to several vacuum buffer volumes, the hollows must be provided in the sole plate in such a manner that just one vacuum buffer volume at a time is connected to the hole, seeing as, otherwise, one vacuum buffer volume would be connected to another vacuum buffer volume via the hole. This means that, between the hollows in the sole plate, a width of sealing surface of at least the diameter of the hole must be present.

It should be mentioned that it is also possible to form the hollows in such a manner that these also form the vacuum buffer volumes.

In yet another embodiment of the invention, the vacuum means comprise a vacuum valve.

Particularly in those instances in which the hole has a large diameter, it is attractive to realize the connection to the vacuum buffer volumes via a vacuum valve. This is because it is then not necessary to provide hollows in the sole plate at a mutual separation of at least the diameter of the hole.

In yet another embodiment of the invention, the smooth surface and the sealing surface of the sole plate together form a sliding bearing.

The vacuum seal between the smooth surface and the sealing surface of the sole plate is formed in this embodiment by placing the two surfaces against one another.

It should be mentioned that, as is known to the skilled artisan, so as to realize a good performance of the vacuum seal formed by the smooth surface and the sealing surface of the sole plate, it is necessary that the distance between the two surfaces be kept very small. The minimal gap occurring between the smooth surface and the sealing surface will then form such a vacuum restriction that inward air leakage via this gap can easily be removed by the vacuum pumps.

By embodying the vacuum seal as a sliding bearing, the vacuum seal will yield a good performance. In sliding the sole plate, the frictional force that occurs between the smooth surface and the sealing surface will now have to be overcome.

It should be mentioned that the choice of materials that form the sheet and the sole plate determines the coefficient of friction. A combination of, for example, steel and a ceramic material leads to a relatively low coefficient of friction. Experiments have shown that, in the case of a suitable choice of materials, a pumping rate of 3 l/s can achieve a vacuum of approximately 0.5 mbar on an evacuated surface of 130×50 mm². The maximal coefficient of friction in this experiment amounted to approximately 15 N.

An advantage of this embodiment is that, as a result of the frictional force that occurs, the mutual position of the smooth surface and the sole plate remains unchanged in the case of the occurrence of forces smaller than the maximum frictional force. This is particularly desirable in applications of the apparatus whereby, in evacuated state, the position of the sample with respect to the vacuum column must remain unchanged. One can think in this case of an analysis with the aid of a SEM column, which SEM column forms the vacuum column.

It should be mentioned that, as is known to the skilled artisan, it is also possible to embody the bearing as an air bearing.

In yet another embodiment of the invention, the hole penetrates the sheet, and the side of the sheet located opposite the side upon which the sole plate seals is embodied to seal onto a plane.

By penetrating through the sheet, it is possible to mount the sample in the hole by placing the hole over the sample. The undersurface of the plane in which the hole is cut out will hereby seal onto the surface on which the sample is placed. This sealing can, for example, occur via an O-ring. The surface on which the sample is placed can be a metal plate, but can also be a glass plate, for example, such as is used in conjunction with optical microscopes.

In yet another embodiment of the invention, the hole assumes the form of a cavity.

By providing the plate with one or more cavities in which a sample can be laid, the sample can be evacuated by moving the sole plate to the position of the desired cavity.

In another embodiment of the invention, the vacuum column comprises an analysis column.

Various analysis techniques require that the sample to be analyzed be evacuated. By now fixing an analysis column to the sole plate, in such a manner that this forms part of the vacuum column or comprises the entire vacuum column, such a sample can be analyzed in a simple manner.

In a further embodiment of the invention, the vacuum column is embodied to generate electrically charged particles.

A known technique in which it is required that the sample be located in vacuum is, for example, inspection with a focused electron beam. Apparatus employing such a beam of electrons are known per se, e.g. in the case of an Environmental Scanning Electron Microscope (ESEM).

It should be mentioned that it is also possible to employ analysis or fabrication techniques whereby, simultaneously or almost simultaneously, the surface of the sample is removed or modified with the aid of a beam of charged particles, such as ions. For example, by repeatedly removing a surface layer of the sample, it is possible to make a spatial 3D analysis of the sample. The use of such a beam is known per se from, for example, Focused Ion Beam (FIB) apparatus, in which a focused ion beam is employed, and dual-beam apparatus, in which both a focused ion beam and a focused electron beam are employed.

In yet another embodiment of the invention, the vacuum column is embodied to generate photons.

A method, known per se, for illuminating semiconductor wafers comprises irradiating the wafers with light of very short wavelength—so-called Extreme UV (EUV). The radiation employed in the case of EUV, with a wavelength of 13.4 nm, for example, is substantially absorbed by air. To prevent such absorption, it is therefore desirable to evacuate the wafer in this procedure.

Another method known per se is so-called "laser welding", whereby a laser joint is made with the aid of a laser. In this situation, it is desirable that the parts to be welded to one another be located in a vacuum, so that no oxidations or otherwise undesirable chemical reactions can occur.

The invention will be described on the basis of figures, whereby identical reference numerals indicate corresponding elements.

Figure 1B:
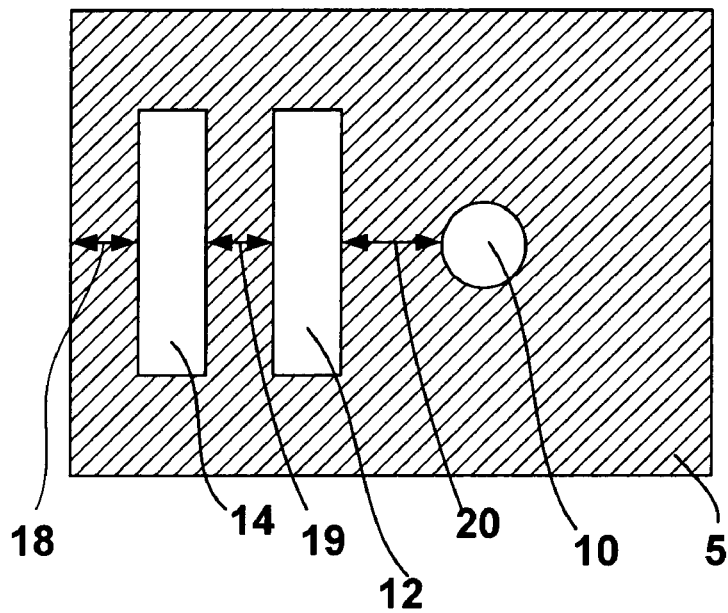
Figure 2:
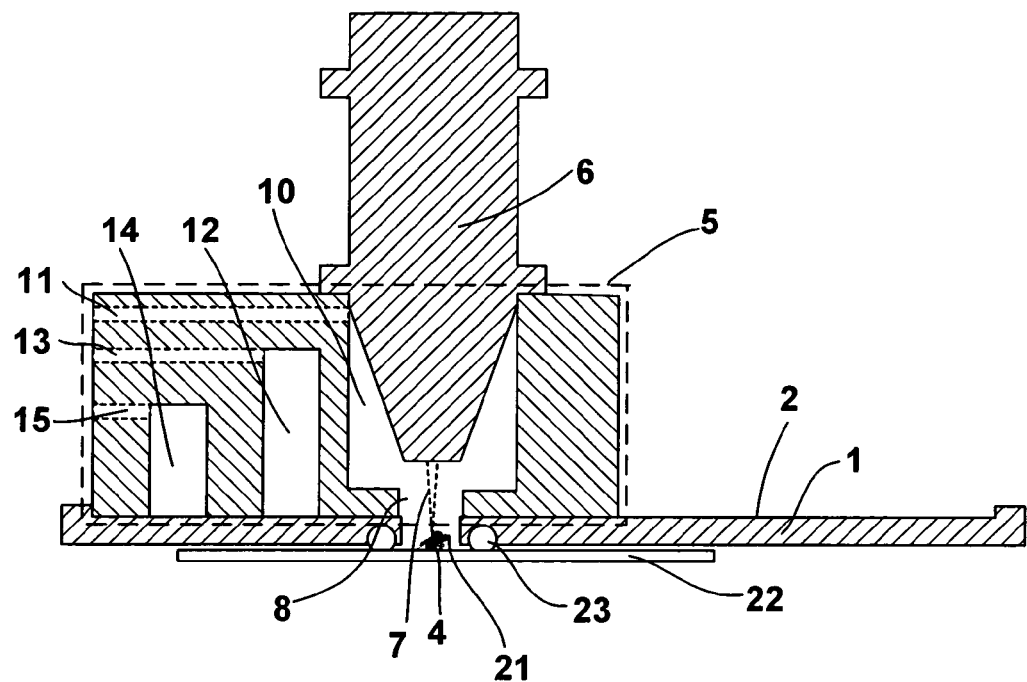
Figure 3:
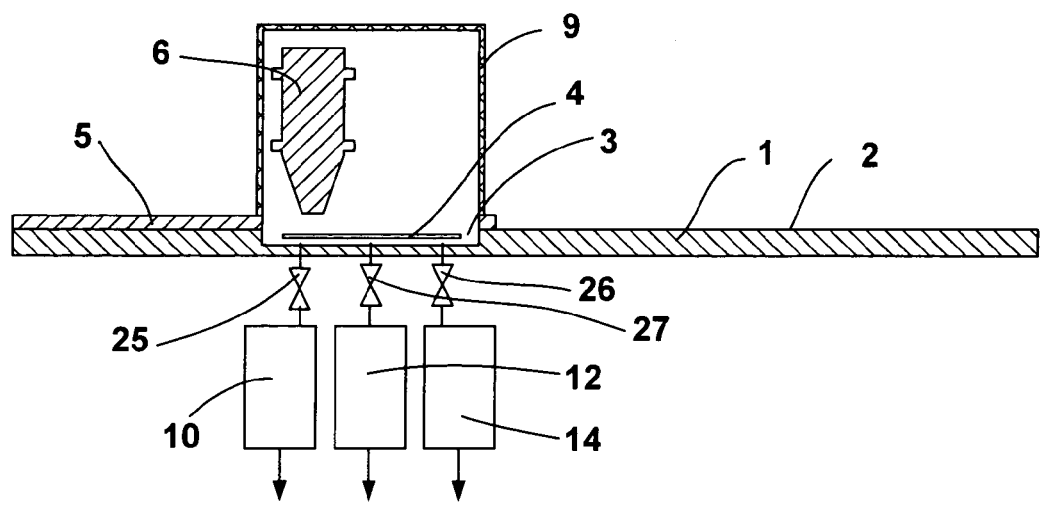

To this end:

FIG. 1A schematically depicts an apparatus according to the invention, whereby the sample is laid in a cavity;

FIG. 1B schematically depicts the side of the sole plate which seals onto the smooth surface;

FIG. 2 schematically shows an apparatus according to the invention, whereby the sample is laid on a glass microscope slide;

FIG. 3 schematically shows an apparatus according to the invention, whereby an analysis column, which is movable in a vacuum column, is analyzing a wafer.

FIG. 1A schematically depicts an apparatus according to the invention, whereby the sample is laid in a cavity.

The depicted apparatus comprises a sheet 1 with a smooth surface 2, in which smooth surface 2 a hole in the form of a cavity 3 is cut out. A sample 4 is laid in this cavity 3. Sole plate 5 is placed on the smooth surface 2 and is movable across the smooth surface 2 in a vacuum-tight manner.

FIG. 1B schematically shows the side of the sole plate 5 that seals onto the smooth surface 2.

The sole plate 5 is provided with hollows that form vacuum buffer volumes 10, 12 and 14. These vacuum buffer volumes are connected to (non-depicted) vacuum pumps via the respective shafts 11, 13 and 15.

A vacuum column in the form of, for example, a column of an Environmental Scanning Electron Microscope (ESEM column) 6, which generates a focused electron beam 7, is affixed to the sole plate 5. An ESEM, which is an apparatus known per se, can analyze a sample at a pressure in the vicinity of the sample of approx. 10 mbar or less. The electron beam 7 produced by the ESEM column 6 probes the sample 4 via the hollow 8 in the sole plate 5. The electron beam 7 hereby induces the emission of, for example, radiation such as secondary electrons and X-ray radiation, which can be detected with the aid of (non-depicted) detectors.

Before introducing a sample 4, the sole plate 5 is first slid across the smooth surface 2 in such a manner that the cavity 3 is not covered by the sole plate 5. It is then easy to remove from the cavity 3 any sample that has already been analyzed, and to lay in the cavity a subsequent sample that is to be analyzed.

Next, the sole plate is slid across the smooth surface, as a result of which the cavity 3 is successively connected to vacuum buffer volumes 14, 12 and 10. The volume of the vacuum buffer volumes is a few times greater, e.g. ten times greater, than the volume of the cavity 3. When such a vacuum buffer volume is connected to the cavity 3, the pressure in the cavity will decrease almost instantaneously by a factor of, for example, ten.

In the depicted position, the pressure will hereby be reduced in three steps, each of a factor of ten, for example, so that the pressure decreases in total by a factor of $10^3$. Assuming that the pressure upon introducing the sample was 1 bar, the pressure is reduced to 1 mbar, which pressure is sufficiently low for analysis with the aid of an ESEM column (and for various other analysis techniques).

The separation 18 between the surroundings and the first vacuum buffer volume 14 is of such a size that, before the cavity 3 is connected to the first vacuum buffer volume, the cavity is completely covered. In this manner, one prevents the vacuum buffer volume 14 from being momentarily connected to ambient pressure via the cavity 3. This requires that the width of separation 18 be greater than the diameter of cavity 3.

In the same manner, the separation 19 between the first vacuum buffer volume 14 and the second vacuum buffer volume 12 has a width greater than the diameter of the cavity, just as does the separation 20 between the second vacuum buffer volume 12 and the third vacuum buffer volume 10.

In the depicted apparatus, the hollows in the sole plate 5 that form the vacuum buffer volumes 10 and 12 are asymmetrically formed. It should be clear that embodiments are also possible whereby the hollows are, for example, formed concentrically about the vacuum buffer volume 10.

It should be mentioned that, for other desired pressures, the apparatus can be equipped with a different number of vacuum buffer volumes, or one can choose a different ratio between the volume of the cavity and the size of the vacuum buffer volumes.

In the depicted apparatus, only one hole 3, in which a sample 4 can be placed, is made in the sheet 1. It should be clear that an apparatus according to the invention can be provided with a plurality of holes in which samples can be placed, whereby one or more holes can be covered by the sole plate 5. For example, it is possible to position the sole plate in such a manner that a first hole is connected to vacuum buffer volume 14, while a second hole is connected to vacuum buffer volume 12, and the third hole is connected to vacuum buffer volume 10.

It should be mentioned that it is not necessary to connect each vacuum buffer volume to a separate pump. As is known to the skilled artisan, by applying the correct pump resistances between the vacuum buffer volumes and the vacuum pump, it is possible—using only one vacuum pump—to evacuate, for example, three vacuum buffer volumes in such a manner that, when one of the vacuum buffer volumes is evacuating the cavity (whereby, of course, the pressure in the vacuum buffer volume concerned will change), the pressure in the other vacuum buffer volumes will be influenced either not at all or only to a slight extent.

FIG. 2 can be regarded as arising out of FIG. 1. The hole 3 assumes the form of a penetration of the sheet 1. The sample 4 is placed on a smooth surface in the form of a glass microscope slide 22, and the hole 3 is placed over the sample 4. The seal between the hole 3 and the microscope slide 22 is formed by sealing means in the form of an O-ring 23.

In this embodiment, the sample 4 is placed on a relatively simple, cheap and disposable glass microscope slide. This is particularly of advantage in applications whereby, for example, one first goes to work with an optical microscope. Hereafter, an analysis can be performed in vacuum, or, using an ESEM column 6, for example, the sample 4 can be inspected at a higher resolution than the resolution that is possible with an optical microscope.

It should be mentioned that, with an ESEM column, it is possible to obtain an image of an electrically isolated sample without being troubled by electrical charging. Nevertheless, if the application in question requires the sample to be electrically connected to earth, then one can, for example, make use of a glass microscope slide onto which metal has been evaporated, or, instead of a glass microscope slide 22, one can make use of a metal plate, for example.

FIG. 3 schematically depicts an apparatus according to the invention whereby a wafer is being analyzed by an analysis column that is movable in a vacuum column.

The depicted apparatus comprises a sheet 1 with a smooth surface 2, in which smooth surface 2 a hole in the form of a cavity 3 has been cut out. A sample in the form of a semiconductor wafer 4 is laid in this cavity 3. Sole plate 5 is placed on the smooth surface 2 and is movable across the smooth surface 2. Upon the sole plate 5 a vacuum column 9 is mounted, in which vacuum is maintained using non-depicted evacuation means. Within the vacuum column 9 is located an analysis column, such as an ESEM column 6, which is movable within the vacuum column 9 (with the aid of non-depicted moving means). The cavity 3 is connected to vacuum valves (25, 26, 27) that can connect the cavity 3 to vacuum buffer volumes 10, 12 and 14. These vacuum buffer means are evacuated by (non-depicted) vacuum pumps.

Before introducing a wafer 4, the sole plate 5 is first slid across the smooth surface 2 in such a manner that the cavity 3 is not covered by the sole plate 5. The vacuum valves (25, 26, 27) are hereby closed, so that the vacuum buffer volumes (10, 12, 14) are not in vacuum connection with the cavity 3.

After introducing the wafer 4, the sole plate 5 is slid across the smooth surface 2 in such a manner that the cavity 3 is completely covered by the sole plate 5, but there is no vacuum connection between the cavity 3 and the vacuum column 9. Thereafter, the cavity 3 is successively connected to the vacuum buffer volumes 10, 12 and 14 by opening and closing the vacuum valves 25, 26 and 27.

It should be mentioned that, in general, one of the vacuum valves (25, 26, 27) at most will be opened, so that the vacuum buffer volumes (10, 12, 14) will not be brought into vacuum connection with one another.

Thereafter, the sole plate 5 is slid across the smooth surface 2 in such a manner that the vacuum column 9 is positioned above the cavity 3. The ESEM column 6, which is movable within the vacuum column 9, is thereafter moved to a region of interest of the wafer 4 to be analyzed.

After the analysis, air is let into the cavity 3 by moving the sole plate 5 across the smooth surface 2 in such a manner that the cavity is no longer covered by the sole plate.

It should be mentioned that it is also possible to let air into the cavity 3 using a separate, non-depicted air inlet valve. Admission of air can occur when the sole plate 5 is slid in such a manner that the cavity 3 is still covered by the sole plate 5, but the cavity 3 is no longer in vacuum connection with the vacuum column 9. Instead of admitting air, one could also admit nitrogen, for example.

The invention claimed is:

1. An apparatus for evacuating at least a portion of a sample region, comprising:
    a sheet provided with a smooth surface, in which smooth surface at least one sample hole is created in which to place the sample;
    a sole plate that is slidable with respect to the smooth surface, which sole plate provides a sealing surface with respect to the smooth surface;
    which sole plate presents a through-hole in such a manner that one end of the through-hole penetrates the sealing surface and the other end of the through-hole is connected to the inside of a vacuum column;
    the entire sample hole is evacuated; and
    the sole plate can folly cover the sample hole.

2. An apparatus according to claim 1, whereby vacuum means are present to evacuate the sample hole before connecting the sample hole to the vacuum column, by connecting the sample hole to at least one vacuum buffer volume, which vacuum buffer volume has a volume greater than the volume of the sample hole.

3. An apparatus according to claim 2, whereby the vacuum means assume the form of vacuum means to successively connect the hole to a number of vacuum buffer volumes.

4. An apparatus according to claim 2, whereby the vacuum buffer volume is connected to a hollow in the sealing surface of the sole plate.

5. An apparatus according to claim 2, whereby the vacuum means comprise a vacuum valve.

6. An apparatus according to claim 1, whereby the smooth surface and the sealing surface of the sole plate together form a sliding bearing.

7. An apparatus according to claim 1, whereby the hole penetrates the sheet, and the side of the sheet located opposite the side upon which the sole plate seals is embodied to seal onto a plane.

8. An apparatus according to claim 1, whereby the sample hole assumes the form of a cavity.

9. An apparatus according to claim 1, whereby the vacuum column comprises an analysis column.

10. An apparatus according to claim 1, whereby the vacuum column is embodied to generate electrically charged particles.

11. An apparatus according to claim 1, whereby the vacuum column comprises a column embodied to generate photons.

12. An apparatus for observing a sample in a vacuum, comprising:
    a vacuum chamber including a portion of an instrument for observing a sample;
    a sheet having a cavity therein for positioning the sample;
    a sole plate slidable over the sheet and having a vacuum seal between the sheet and the sole plate, the sole plate having a hole, such that in a first relative position between the sole plate and the sheet, the hole connects the cavity to the vacuum chamber so that the instrument can observe the sample and in a second position, the hole faces the surface of the sheet, thereby maintaining a vacuum in the vacuum chamber.

13. The apparatus of claim 12 in which the instrument is a scanning electron microscope.

14. The apparatus of claim 12 further comprising at least one vacuum buffer that can communicate with the cavity to facilitate evacuation of the cavity.

15. The apparatus of claim 14 in which the cavity selectively communicates with the one or more vacuum buffers or with the vacuum chamber by relative motion between the sheet and the plate to expose the cavity to the one or more vacuum buffers or to the vacuum chamber.

16. The apparatus of claim 14 in which the cavity communicate with the one or more vacuum buffer through one or more vacuum valves.

17. The apparatus of claim 12 in which the bottom of the cavity is formed by a structure other than the sheet.

18. A method of observing a sample in an apparatus including a vacuum chamber, a sheet having a cavity therein, and a plate, comprising:
    altering the relative position of the plate and the cavity so that the vacuum chamber is sealed and the cavity is exposed for loading a sample;
    altering the relative position of the plate and the cavity so that the cavity is aligned with the vacuum chamber and in vacuum communication with the vacuum chamber, and the sample in the cavity is exposed to the vacuum in the vacuum chamber; and
    observing the sample under vacuum.

19. The method of claim 18 in which observing the sample under vacuum includes observing the sample using an electron microscope.

20. The method of claim 18 further comprising putting the cavity in vacuum communication with one or more vacuum buffers to at least partially evacuate the cavity before altering the relative position of the plate and the cavity so that the cavity is aligned with the vacuum chamber and in vacuum communication with the vacuum chamber.

21. The method of claim 20 in which putting the cavity in vacuum communication with one or more vacuum buffers includes altering the relative position of the plate and the one or more vacuum buffers to align the cavity with at least one or the one or more vacuum buffers.

22. The method of claim 20 in which putting the cavity in vacuum communication with one or more vacuum buffers includes opening one or more valves between the cavity and at least one or the one or more vacuum buffers.

* * * * *